(12) United States Patent
Tanoue et al.

(10) Patent No.: US 6,984,871 B2
(45) Date of Patent: Jan. 10, 2006

(54) SEMICONDUCTOR DEVICE WITH HIGH STRUCTURAL RELIABILITY AND LOW PARASITIC CAPACITANCE

(75) Inventors: Tomonori Tanoue, Machida (JP); Kazuhiro Mochizuki, Tokyo (JP); Hiroji Yamada, Shiroyama (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/441,096

(22) Filed: May 20, 2003

(65) Prior Publication Data

US 2004/0026713 A1  Feb. 12, 2004

(30) Foreign Application Priority Data

Aug. 9, 2002  (JP) ............................. 2002-232623

(51) Int. Cl.
 *H01L 27/082* (2006.01)
(52) U.S. Cl. ..................... 257/573; 257/578; 257/586; 257/587; 438/235; 438/309; 438/312
(58) Field of Classification Search ........ 257/197–198, 257/573, 578, 584, 586, 587; 438/235, 309, 438/312
See application file for complete search history.

(56) References Cited

U.S. PATENT DOCUMENTS

| 5,485,025 | A | * | 1/1996 | Chau et al. ................. 257/198 |
| 5,729,033 | A | * | 3/1998 | Hafizi ........................ 257/198 |
| 6,696,711 | B2 | * | 2/2004 | Mochizuki et al. ......... 257/197 |

FOREIGN PATENT DOCUMENTS

| JP | 62-177966 | 1/1986 |
| JP | 6-5620 | 6/1992 |

* cited by examiner

*Primary Examiner*—Donghee Kang
(74) *Attorney, Agent, or Firm*—Reed Smith LLP; Stanley P. Fisher, Esq.; Juan Carlos A. Marquez, Esq.

(57) ABSTRACT

A semiconductor device with high structural reliability and low parasitic capacitance is provided. In one example, the semiconductor device has a surface. The semiconductor device comprises a semiconductor region, wherein an emitter region, a base region, and a collector region are laminated from a side near a substrate of the semiconductor region; an insulating protection layer disposed on the surface; and a wiring layer disposed on the surface, the insulating protection layer forming a via hole from the side of the substrate of the semiconductor region, the via hole being formed to allow the wiring layer to make a contact to an electrode of the emitter region from a side of the substrate where the emitter region, the base region, and the collector region are laminated and where the semiconductor region is isolated.

10 Claims, 11 Drawing Sheets

F I G. 1
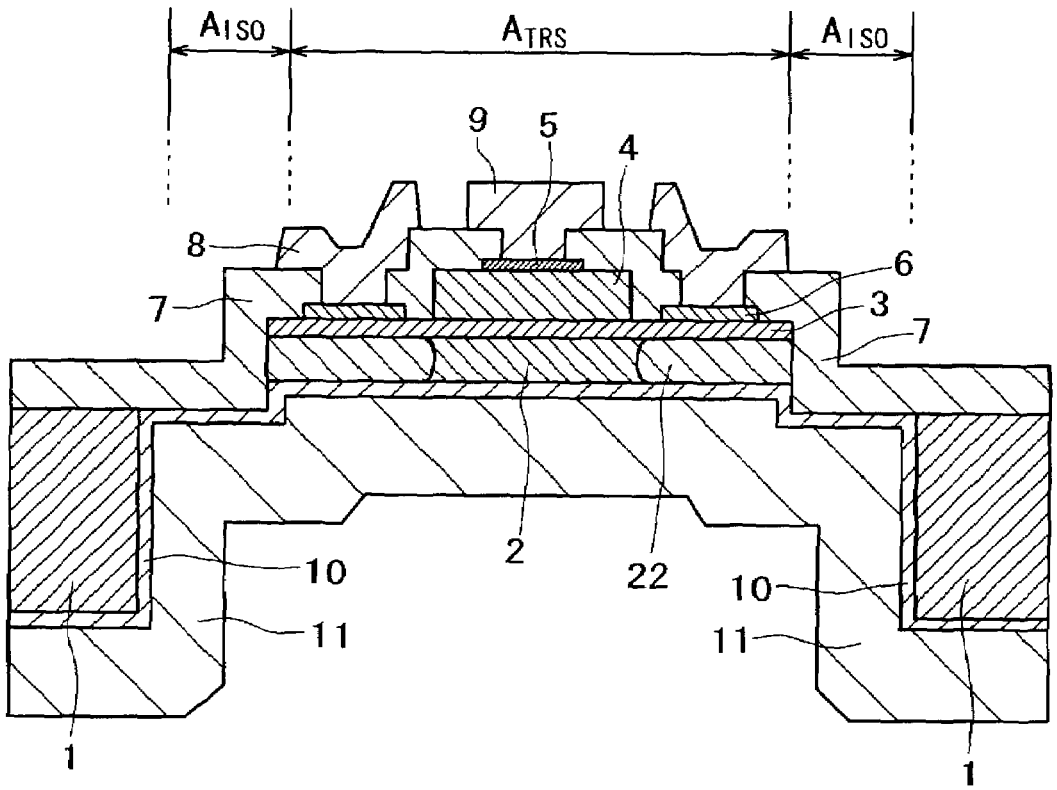
F I G. 2
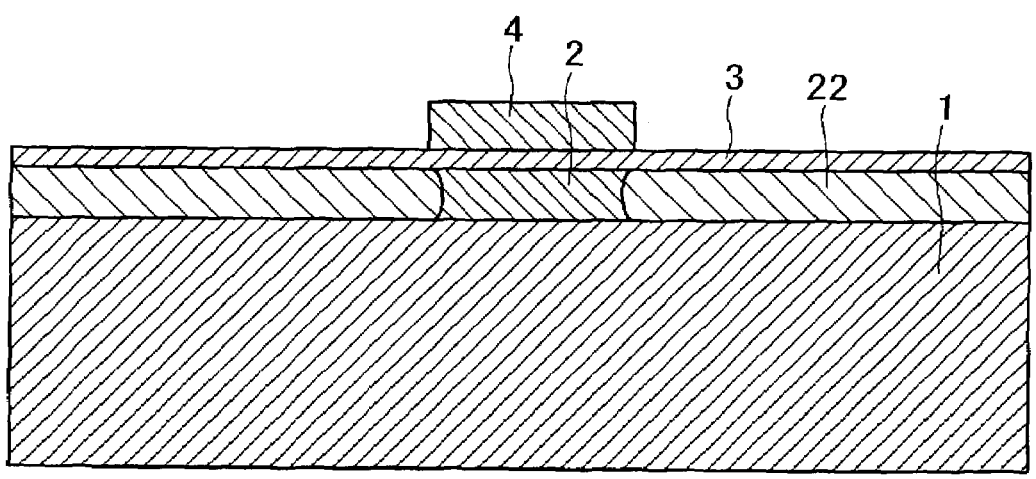

F I G. 1 3
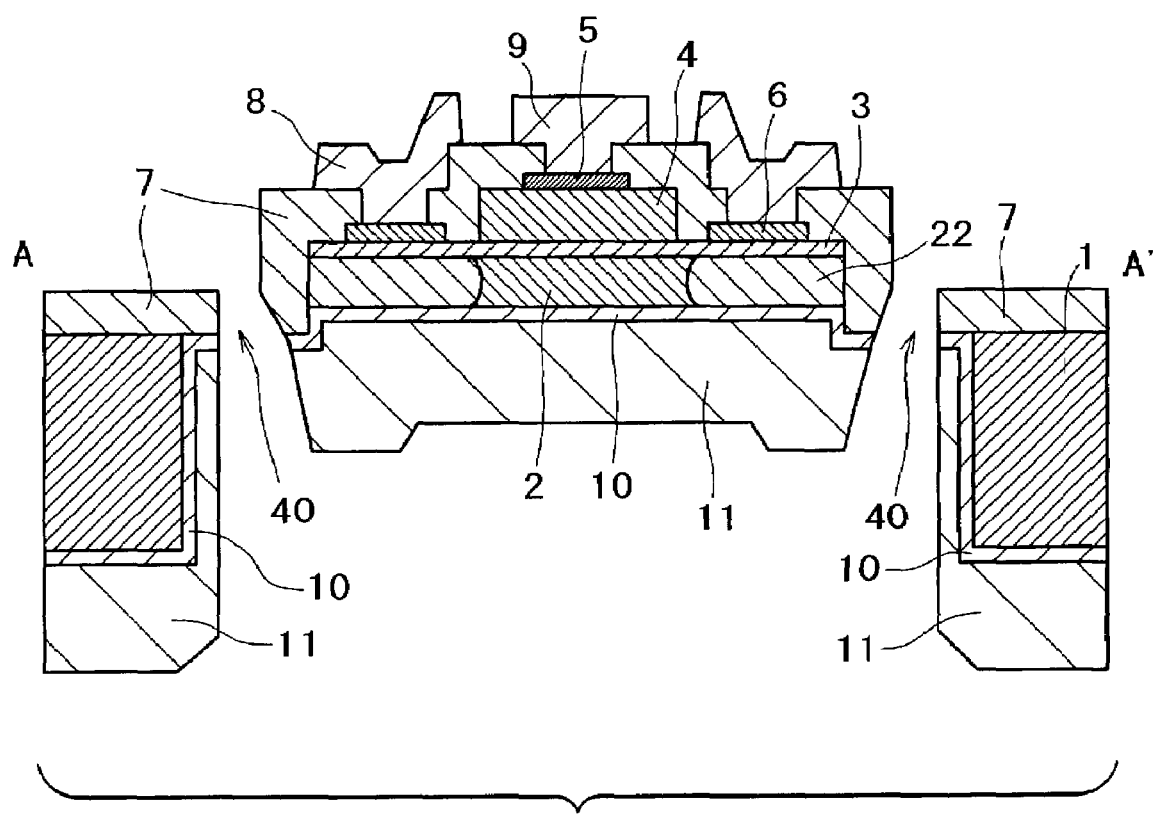

SEMICONDUCTOR DEVICE WITH HIGH STRUCTURAL RELIABILITY AND LOW PARASITIC CAPACITANCE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention generally relates to a semiconductor device of excellent high frequency operation and, more particular, to a semiconductor device having high structural reliability while reducing the parasitic capacitance as low as possible.

2. Discussion of Background

As a structure of an existing semiconductor device of excellent high frequency operation, a hetero-junction bipolar transistor disclosed in JP-A No. 177966/1987 (prior art 1) has been known. In the device structure of the prior art 1, an emitter layer comprising a broad band gap N-type semiconductor layer, a base layer comprising a P-type semiconductor layer and a collector layer comprising an N-type semiconductor layer are stacked on a semi-insulating GaAs substrate successively from the side of the substrate, in which a collector electrode is disposed at the uppermost layer using an AuGe alloy, a base electrode is disposed to the base layer exposed by etching using an AuZn alloy and an emitter electrode is disposed after back side polishing of the semi-insulating GaAs substrate by back side metal vapor deposition of AuGe utilizing a via hole formed by etching that reaches the emitter layer.

While the prior art 1 does not describe device isolation, isolation of a transistor region from other regions has to be conducted, for example, by etching from the surface before the back side polishing step and the contact region to the emitter layer is smaller than the isolated transistor region.

Further, another example of forming the electrode of a transistor by way of a via hole from the back side is disclosed in JP-A No. 5620/1994 (prior art 2). In the prior art 2, the lowermost layer is a collector contact layer and device isolation is conducted by implanting hydrogen ions to the isolating region, thereby forming ion implantation layer of transforming a conductive layer into an insulating layer. In this case, the thickness of the semiconductor layer near the trench at the back side is a total of the thickness of each of the collector layer, the emitter layer, and the base layer, which is about several $\mu$m at the greatest.

However, when mesa etching is conducted for the device isolation as described above in the structure of prior art 1, production yield is lowered when the via hole and the mesa etching region are not aligned strictly at the back side etching step of forming a via hole from the back side in the inside of a transistor region to dispose a conduct region of the emitter electrode. Further, when a large alignment margin is taken in order to avoid lowering of the yield, the chip area is increased to increase the chip cost.

Prior art 2, while there is no requirement for disposing an electrode contact region to the inside of the transistor region, when the trench on the back side is made larger, the area of a thin region of several micrometers is increased to possibly deteriorate the mechanical strength.

Further, in both of the prior art 1 and the prior art 2, when adhesion with an organic adhesive such as an epoxy type paste is conducted upon chip bonding, the pressure in the via hole increases due to vapors of a solvent generated in the via hole by heating and drying of the adhesive to sometimes destroy the semiconductor region on the via hole.

Further, this results in a structure of leaving a thin semiconductor layer of about several $\mu$m or less at the largest to a portion near the electrode contact region, and stresses upon chip bonding such as by pressure increase in the via hole are concentrated in the thin semiconductor region, and induce cracks of crystals, which extend as far as the transistor region tending to cause failure due to chip destruction or transistor destruction.

SUMMARY OF THE INVENTION

The present invention intends to provide a high performance semiconductor device, capable of moderating the accuracy for the aligning margin upon back side fabrication step, preventing destruction upon bonding caused by pressure elevation in the inside of a via hole and preventing chip destruction caused by occurrence and extension of cracks.

The present invention provides a bipolar semiconductor device having a semiconductor region with an emitter, a base and a collector laminated successively from the side near a substrate, in which an insulating protection film and a wiring layer are disposed on the surface and a via hole for leading out an electrode contact to the emitter is formed from the side of the substrate, wherein a semiconductor region in which the regions of the emitter, the base and the collector are laminated and the semiconductor region of the substrate are isolated.

The isolated structure described above can be attained as a structure in which via holes are formed for the laminated semiconductor region, that is, a region larger than the transistor region, and by which the transistor region and the substrate are isolated as the semiconductor and connected by the surface protection film.

This can moderate the accuracy for alignment margin, as well as a region in which the thin semiconductor layer remains is removed to prevent occurrence of cracks. Further, by the provision of an opening reaching the via hole to the surface protection insulating film for connecting the substrate and the transistor region, solvent vapors from the adhesives in the via hole can be released to avoid pressure increase in the via hole.

Further, according to the semiconductor device of the invention, a semiconductor device of obtaining electrode contact to the semiconductor at the lowermost layer by way of a via hole from the back side can be manufactured easily with a large alignment margin, as well as chip destruction by cracking can be prevented.

The invention encompasses other embodiments of a method, an apparatus, and a system which are configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

FIG. 1 is a cross sectional structural view showing a semiconductor device of a first embodiment according to the invention;

FIG. 2 is a cross sectional structural view showing a production step of the semiconductor device shown in FIG. 1;

FIG. 13 is a cross sectional structural view showing a semiconductor device of a fifth embodiment according to the invention;

DESCRIPTION OF THE PREFERRED EMBODIMENTS

Figure 3:
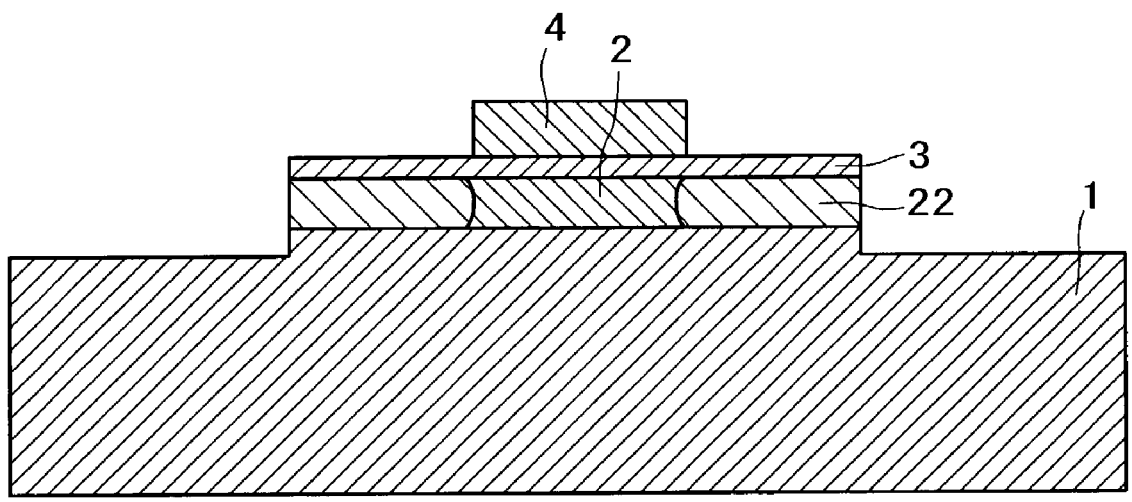
FIG. 3 is a cross sectional structural view showing a production step next to that shown in FIG. 2.

An invention for a semiconductor device with high structural reliability and low parasitic capacitance is disclosed. Numerous specific details are set forth in order to provide a thorough understanding of the present invention. It will be understood, however, to one skilled in the art, that the present invention may be practiced without some or all of these specific details.

<Embodiment 1>

FIG. 1 shows an example of the semiconductor device, in accordance with a first embodiment of the present invention. In FIG. 1, are shown, by reference numerals, a semi-insulating GaAs substrate 1, an emitter layer 2, a base layer 3, a collector layer 4, a collector electrode 5, a base electrode 6, a surface protection insulating film 7 made of $SiO_2$, a base wiring metal 8, a collector wiring metal 9, an emitter electrode 10, an emitter wiring metal 11 formed over the entire back side, and an emitter damaged region 22, respectively. In FIG. 1, $A_{TRS}$ is a transistor region which is occupied by the emitter layer 2. The transistor region $A_{TRS}$ also includes a damaged region 22.

In this embodiment, the opening of a via hole opened to the substrate 1 from the back side is wider than the transistor region $A_{TRS}$, the emitter region 2 and the substrate 1 are isolated and connected by the surface protection insulating film 7, the emitter electrode 10 and the emitter wiring metal 11.

Then, a method of manufacturing a semiconductor device of a structure shown in FIG. 1 is to be described with reference to FIG. 2 to FIG. 9.

Step (1):

The emitter layer 2, the base layer 3, and the collector layer 4 are crystallographically grown successively on the semi-insulating GaAs substrate 1 by a metal organic chemical vapor deposition. The emitter layer 2 is made of n-type InGaP lattice matched with GaAs with a film thickness of 300 nm in which a dopant is silicon (Si) doped such that the electron density is $5\times10^{17}$ cm$^{-3}$. The base layer 3 is made of a GaAs alloy with a film thickness of 100 nm in which a dopant is carbon (C) which is doped such that the hole density is $4\times10^{19}$ cm$^{-3}$. The collector layer 4 is made of an n-type InGaP lattice matched with the GaAs alloy with a film thickness of 600 nm in which a dopant is Si doped such that the electron densities $1\times10^{16}$ cm$^{-3}$. While crystals are grown by using metal organic chemical vapor deposition, other growing method such as molecular beam epitaxy may also be used so long as identical structure can be grown.

Step (2):

The collector layer 4 is etched while leaving a region to be a collector of a transistor by photolithography and etching to obtain a structure shown in FIG. 2. The collector layer 4 can be etched by dry etching using a chlorine gas or by wet etching using an aqueous hydrogen chloride solution. Since the etching by the aqueous hydrogen chloride solution can etch only the collector layer 4 selectively without etching the base layer 3, it is suitable to this step. Further, boron ions were implanted at a room temperature under the conditions at an acceleration energy of 50 keV, with an incident angle of 0° and at a dose of $2\times10^{12}$ cm$^{-2}$ using a photoresist used for etching as a mask. Thus, the damaged region 22 is formed to the emitter region other than the region just below the collector region. At the dose described above, the resistance of the base layer 3 doped to high density does not increase but only the resistance of the emitter layer increases. Accordingly, since injection of electrons from the emitter to the base does not occur in the region other than the region just below the collector layer 4 but injection of electrons and transistor action corresponding thereto are caused only in the region just below the collector layer 4, the current amplification coefficient of the transistor can be improved compared with a case of not conducting ion implantation.

Step (3):

The base and emitter regions are etched by photolithography and etching and, further, the substrate 1 is to leave the transistor region $A_{TRS}$ to obtain a structure shown in FIG. 3. The base layer 3 can be etched by wet etching using a liquid mixture of phosphoric acid:hydrogen peroxide:water, which is employed usually for GaAs etching, or by using dry etching. The InGaP alloy of the emitter layer 2 can be etched by dry etching using a chlorine gas or by wet etching using an aqueous hydrogen chloride solution in the same manner as for the collector layer 4.

Figure 4:
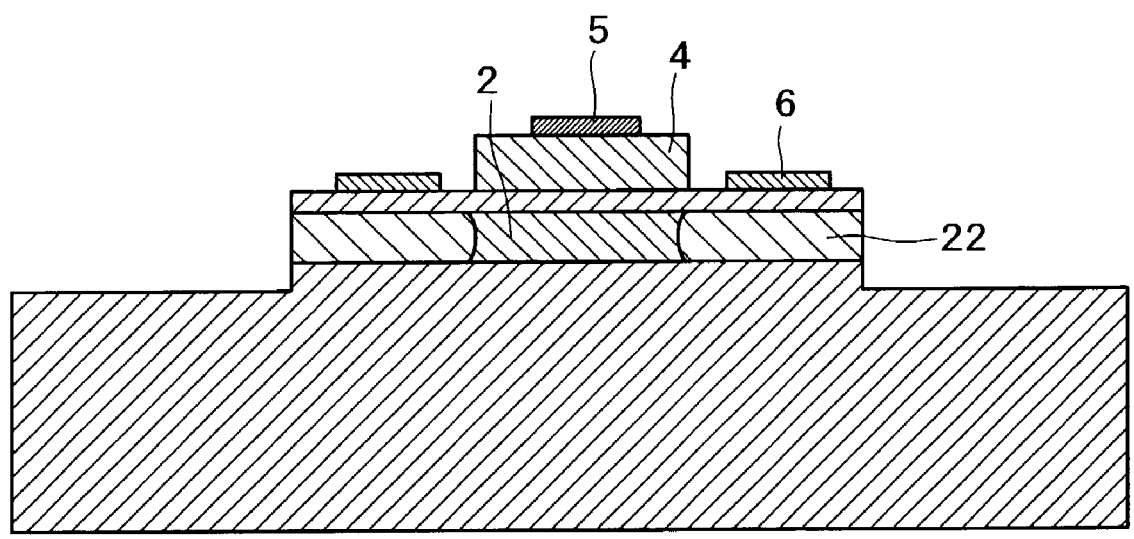
FIG. 4 is a cross sectional structural view showing a production step next to that shown in FIG. 3.

Step (4):

The collector electrode 5 and the base electrode 6 are deposited by repeating photolithography and lift-off steps to obtain a structure shown in FIG. 4. The collector electrode 5 comprises an AuGeNi alloy of 200 nm film thickness and the base electrode 6 comprises a laminate film of Pt (20 nm thickness)/Ti (50 nm thickness)/Au (150 nm thickness).

Pt/Ti/Au represents a structure in which the Pt film, the Ti film and the Au film are laminated with the Pt film being at the lowermost portion and the Au film being at the uppermost portion and this indication is used also in other cases where the kinds of each of the films are different.

Figure 5:
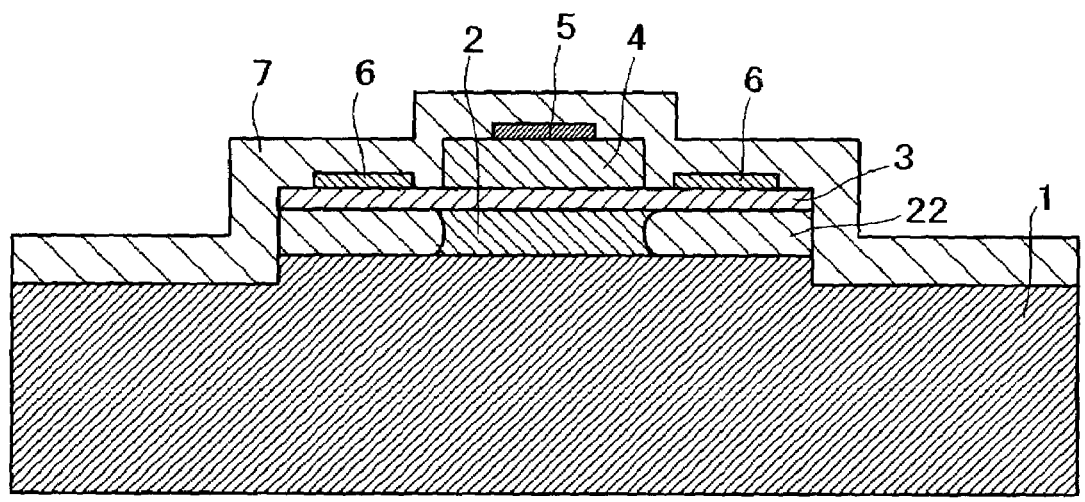
FIG. 5 is a cross sectional structural view showing a production step next to that shown in FIG. 4.

Step (5):

An $SiO_2$ film is deposited on the surface to 500 nm thickness by a thermal CVD process to form a surface protection layer 7 and obtain a structure shown in FIG. 5.

Figure 6:
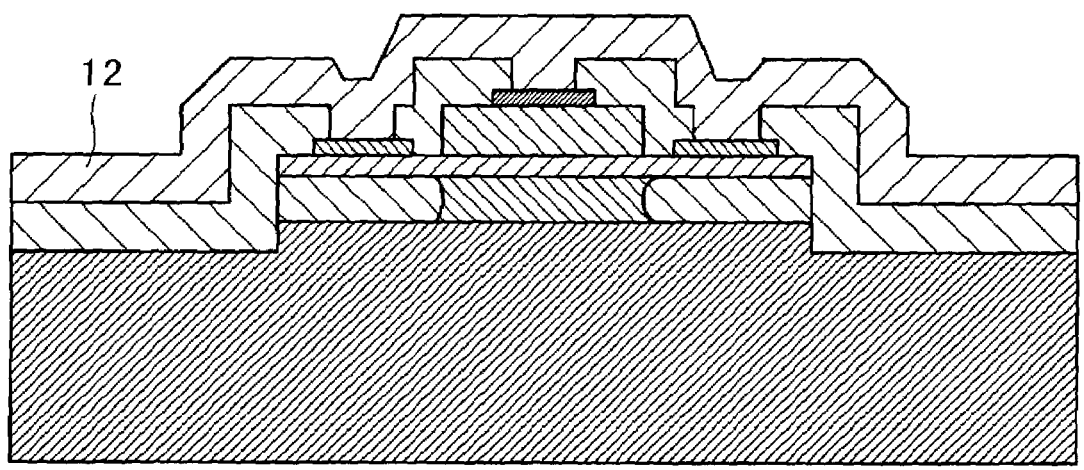
FIG. 6 is a cross sectional structural view showing a production step next to that shown in FIG. 5.

Step (6):

Contact holes between the electrodes and the wirings are opened in the surface protection film 7 by photolithography and etching and, further, Au is deposited to 1 μm as a wiring metal 12 to obtain a structure shown in FIG. 6.

Figure 7:
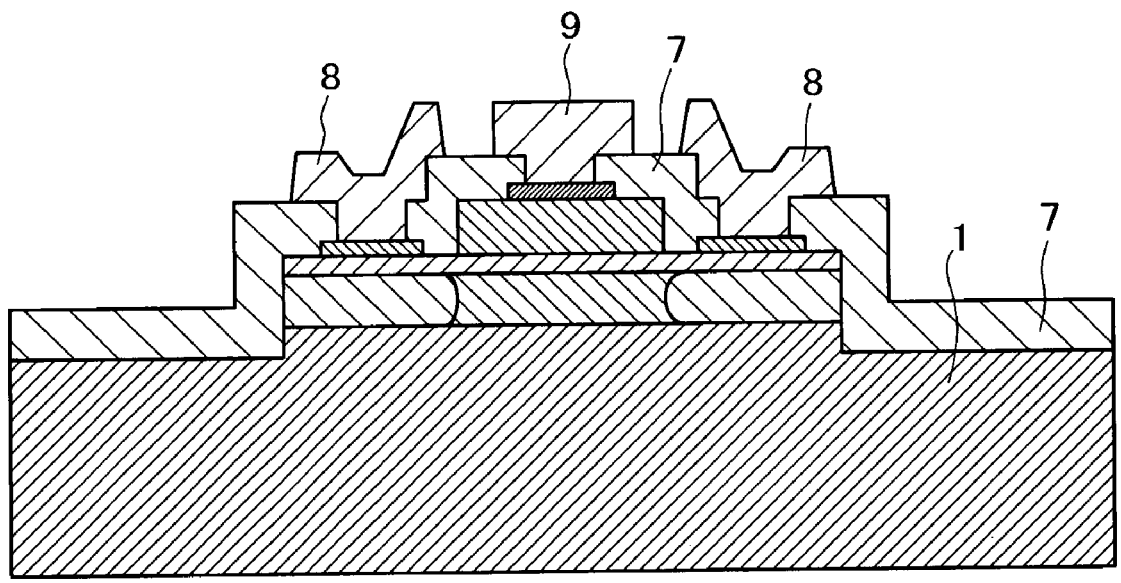
FIG. 7 is a cross sectional structural view showing a production step next to that shown in FIG. 6.

Step (7):

The wiring metal 12 is fabricated by photolithography and ion milling to form base wirings 8 and collector wirings 9 to obtain a structure shown in FIG. 7.

Step (8):

The substrate completed with the surface fabrication as far as the step (7) is appended at the side of the surface to another substrate and back side fabrication is applied so as to expose the back side. It is necessary that another substrate is made of a material for permitting infrared rays used for both face aligning to permeate therethrough, for which surface polished glass substrate which is larger by about 1 to 2 cm than the GaAs substrate 1 may be used. Wax having a melting point at about 80° C. is used for bonding the substrate and flat bonding is attained by equally applying a pressure while melting the wax by heating on a hot plate. The thus bonded GaAs substrate 1 is polished from the back side till the thickness of the substrate is decreased to about 100 μm.

Figure 8:
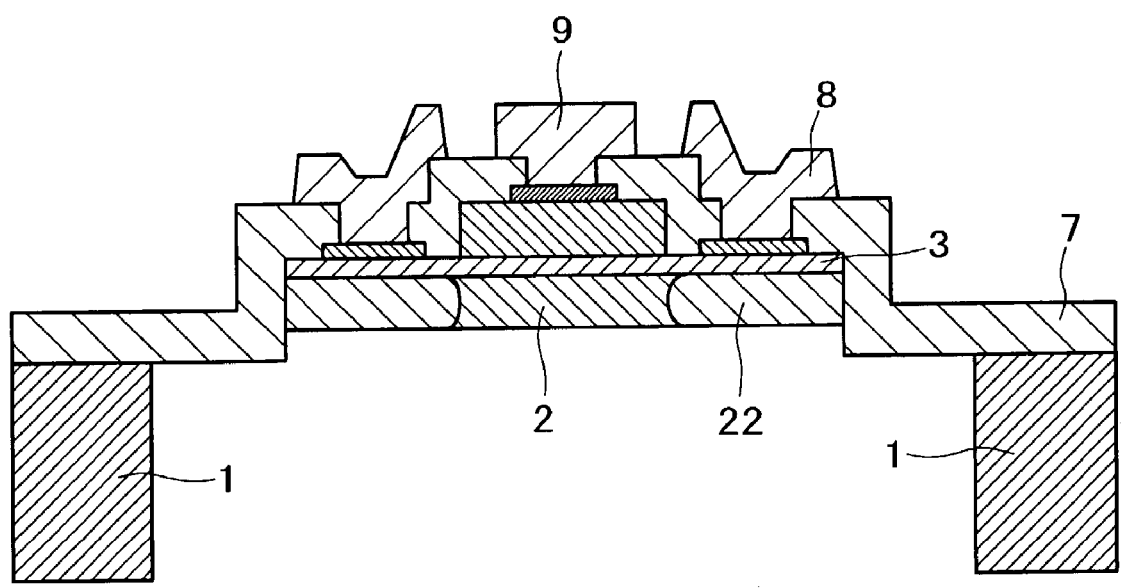
FIG. 8 is a cross sectional structural view showing a production step next to that shown in FIG. 7.

Further, a via hole pattern was formed in the back side of the semi-insulating GaAs substrate just below the transistor by photolithography and wet etching. A structure as shown in FIG. 8 is obtained by completely removing the semi-insulating substrate 1 in the via hole pattern. As the removing method by etching, wet etching using a liquid mixture of sulfuric acid, hydrogen peroxide and water, or dry etching by using $SF_6$ and $SiCl_4$ can be used. When the substrate 1 in the inside of the via hole pattern is completely removed, the lower surface of the emitter layer is exposed in the inside of the transistor region $A_{TRS}$, while the surface protection insulating film 7 is exposed at the outside of the transistor region $A_{TRS}$ in which the transistor region $A_{TRS}$ and the substrate 1 are separated for the semiconductor by way of the isolation region $A_{ISO}$ as viewed from the back side.

Figure 9:
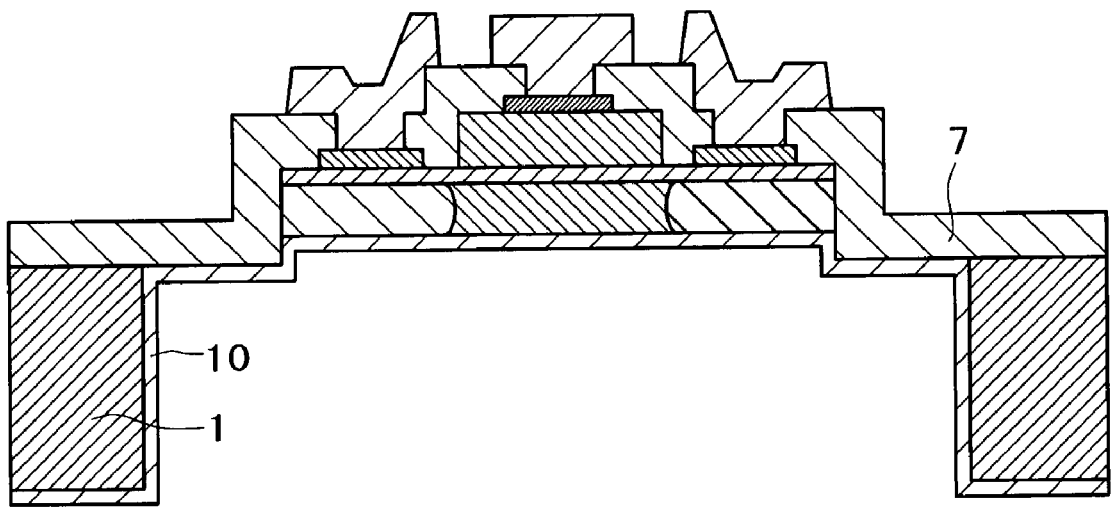
FIG. 9 is a cross sectional structural view showing a production step next to that shown in FIG. 8.

Step (9):

Then, an emitter back side alloy electrode 10 comprising AuGe (60 nm thickness)/Ni (10 nm thickness)/Au (200 nm thickness) is formed for the entire back side of the thin GaAs substrate 1 and alloyed in a nitrogen atmosphere at 350° C. for 30 min to obtain a structure shown in FIG. 9.

Step (10):

Further, Au is plated to 4 μm thickness as an emitter wiring metal 11 on the back side, a structure shown in FIG. 1.

In the semiconductor device of this embodiment, since the heat generated during operation of the collector top type HBT (Heterojunction Bipolar Transistor) can be released not only by way of the collector wiring metal 9 on the side of the surface but also by way of the emitter wirings 11 on back the side of the GaAs substrate 1, thermal runaway can be avoided.

Further, since a region where a thin semiconductor layer near the electrode contact region remains is limited only to the region just below the base electrode, there is no worry of failure that cracks develop in crystals by the stress upon chip bonding and extend as far as the transistor region to result in chip destruction or transistor destruction. Thus, in a power transistor where transistor devices each having a collector size of $2\times20$ $\mu m^2$ are integrated by the number of 120 to chip size $1\times1$ $mm^2$, the chip yield in a 3 inch substrate was increased from 50% to 80%. Further, failure during chip operation was not observed at all during current supply for about 100 hours, and the semiconductor device of this embodiment can provide an effect capable of providing highly reliable power amplifiers.

<Embodiment 2>

Figure 10:
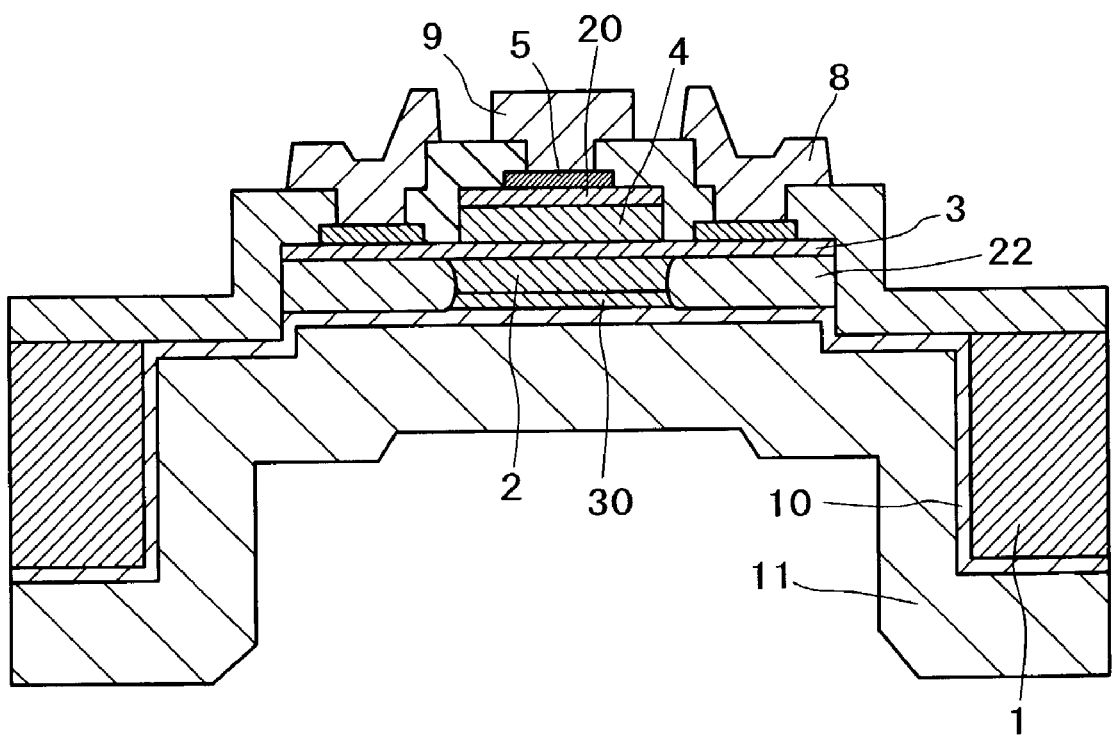
FIG. 10 is a cross sectional structural view showing a semiconductor device of a second embodiment according to the invention.

FIG. 10 is a schematic cross sectional structural view of a semiconductor device according to this embodiment. This is different from Embodiment 1 described above in that an InGaP emitter contact layer 30 doped with impurities till the electron density reaches $5\times10^{18}$ $cm^{-3}$ is disposed between the GaAs substrate 1 and the emitter layer 2, and a GaAs collector contact layer 20 doped with impurities till the electron density also reaches $5\times10^{18}$ cm is disposed on the collector layer 4, during crystal growth in the step (1). The steps of manufacturing the transistor were conducted in the same manner as in Embodiment 1.

Since the high-impurity-density contact layers 20 and 30 are disposed, the emitter resistance and the collector resistance are decreased, that is, the collector resistor is decreased from 10 Ω to 2.5 Ω and the emitter resistance is decreased from 20 Ω to 4 Ω for the device with a collector size of $2\times20$ $\mu m^2$. Thus the cut-off frequency of the device increases to 20 GHz–30 GHz.

<Embodiment 3>

Figure 11:
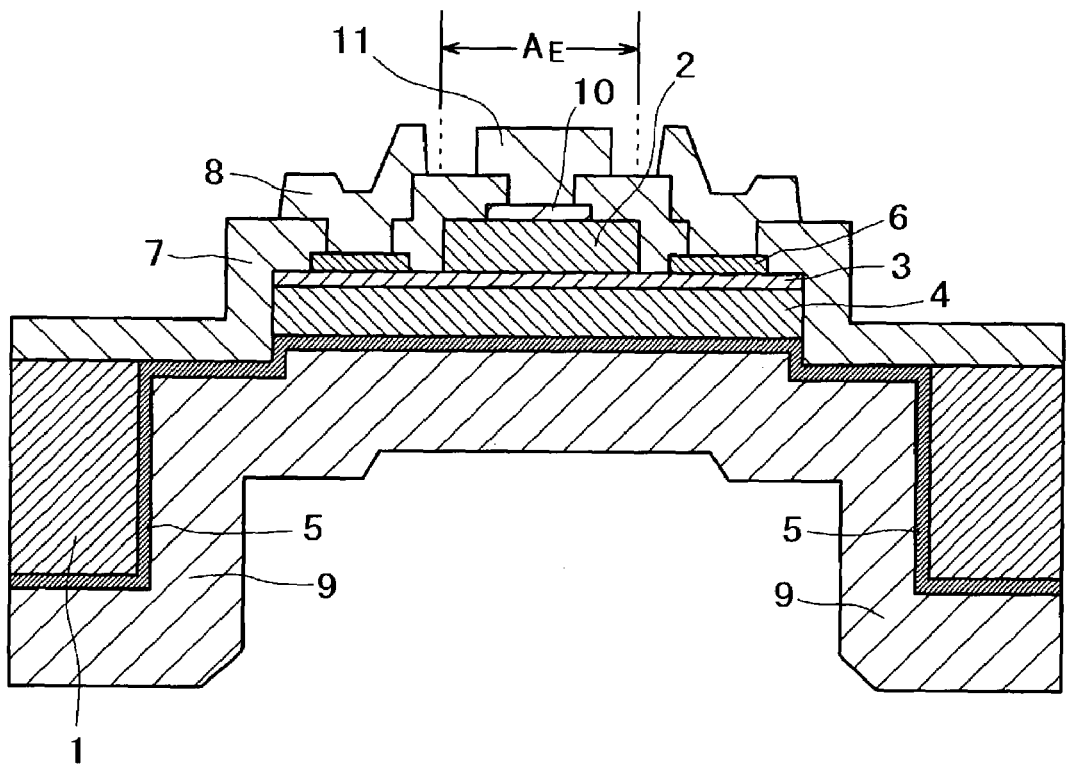
FIG. 11 is a cross sectional structural view showing a semiconductor device of a third embodiment according to the invention.

FIG. 11 shows a schematic cross sectional structural view of a semiconductor device of this embodiment. This is different from Embodiment 1 described above in that the order of depositing the emitter layer 2, the base layer 3 and the collector layer 4 is reversed such that the emitter is on the upper side during crystal growth in Step (1). That is, an emitter-top type transistor was formed. The steps of manufacturing the transistor were conducted in the same manner as in Embodiment 1.

Since only the portion just below the emitter mesa region $A_E$ forms an active region of the transistor by adopting the emitter-top type, there is no requirement for increasing the resistance of the inactive region by ion implantation and the step can be simplified. Further, since the collector electrode 5 and the collector wirings 9 of the metal layer which contribute directly to the heat dissipation are brought into contact at a large area with a collector that causes energy loss in the transistor, thermal resistance is decreased and, in a case of a power transistor where transistor devices each of $2\times20$ $\mu m^2$ size are integrated by the number of 120, the thermal resistance of the emitter top device is reduced from 9° C./W to 6° C./W and a transistor causing less thermal runaway during high power operation can be attained.

<Embodiment 4>

Figure 12:
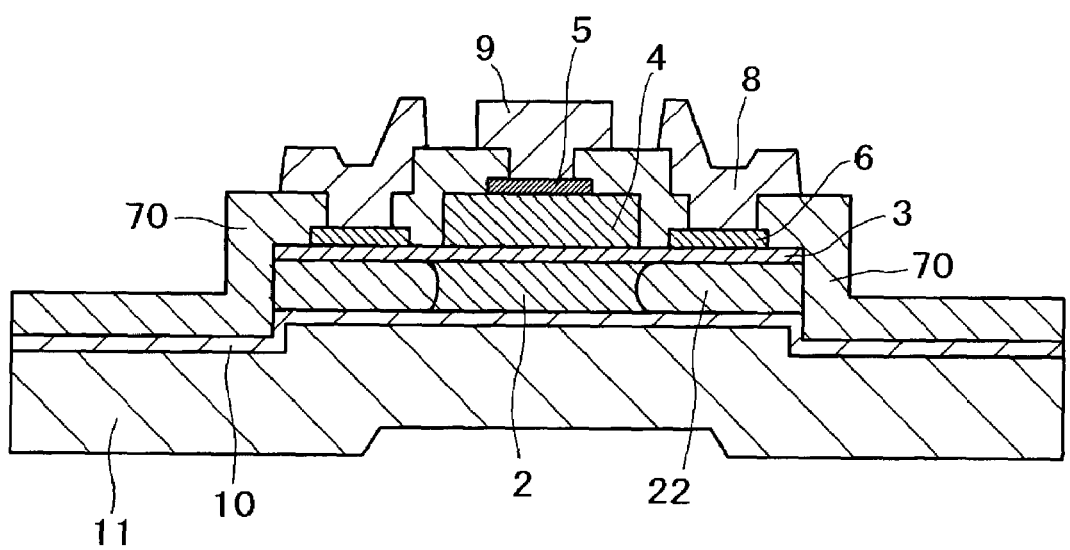
FIG. 12 is a cross sectional structural view showing a semiconductor device of a fourth embodiment according to the invention.

FIG. 12 shows a schematic cross sectional structural view of a semiconductor device of the invention. This is different from Embodiment 1 described above in that the GaAs substrate 1 is removed over the entire back side.

The structure can be obtained by forming the insulating film of the surface protection film 7 formed in the step (5)

of Embodiment 1 with a polyimide layer 70 (coated to 1 μm thickness and cured at 300° C. in a nitrogen ambient), and removing the GaAs substrate 1 over the entire back side without patterning by photolithography upon etching from the back side in the step (8).

The feature of the structure resides in that since the GaAs substrate is removed completely and the transistor region is left in an island shape in an extremely thin structure of about 10 μm thickness comprising a polyimide film 70 and an emitter electrode 10 and emitter wirings 11 of the metal layer, the structure has flexibility. Therefore, the transistor of this embodiment can be bonded directly on a flexible substrate and, for example, a power amplifier can be constituted by mounting the transistor of this embodiment to a hinged portion of a foldable type portable telephone and disposing parts at the vicinity thereof. Thus, the existent hinged portion in which only wirings are folded can be utilized effectively as a part mounting region, which can improve the degree of freedom for the design of the portable telephone and also decrease the size thereof.

<Embodiment 5>

Figure 14:
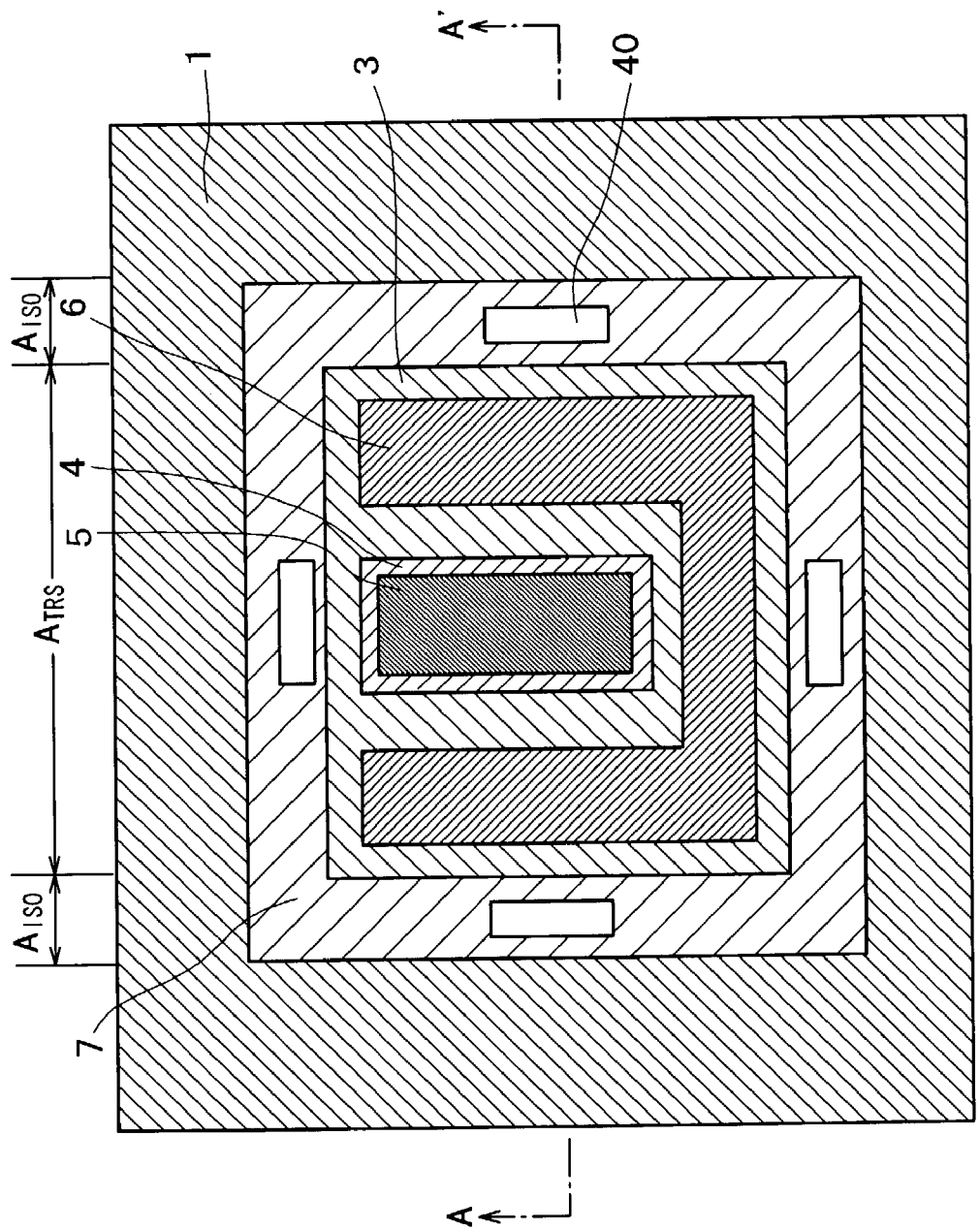
FIG. 14 is a plan view of the semiconductor device shown in FIG. 13.

FIG. 13 shows a schematic cross sectional structural view and FIG. 14 shows a schematic planar structural view of Embodiment 5. The manufacturing steps of this embodiment are as described below.

In Embodiment 1 described above, a step of fabricating a surface protection insulating film 7 is conducted between the step (7) and the step (8) and, finally, the semiconductor substrate is removed and openings 40 are formed as shown in FIG. 13 in a region where the transistor region and the substrate region are connected by the surface protection layer. FIG. 14 is a schematic structural plan view showing the same on the side of the surface. FIG. 13 is a cross sectional view for a portion taken along line A–A' in FIG. 14. In the plan view of FIG. 14, the collector wirings 9 and the base wirings 8 are not illustrated for making the structure clearer.

In the succeeding step (9), a step of covering the openings 40 with a photoresist upon depositing an emitter electrode is added. Au is no more deposited to the opening 40 by the additive and the opening is kept to the last of the process. The openings 40 can release the solvent vapors of adhesives in the inside of the via hole when bonding the chip with an organic material such as an epoxy resin, and prevent pressure elevation in the inside of the via hole.

With the constitution described above, in a case of bonding a power transistor where transistor devices each with a collector size of 2×20 μm² are integrated by the number of 120 within a chip sized 1×1 mm², on a ceramic substrate by an epoxy region, yield after bonding was increased from 80% to 90% or more.

Further, failure during chip operation was not observed at all for current supply of about 100 hours and the embodiment provides an effect capable of realizing highly reliable power amplifier.

<Embodiment 6>

Also in this embodiment while the pattern for the transistor region is identical with that of the transistor shown in the plan view of FIG. 14, a substrate of (001) face is used as a GaAs semiconductor substrate 1 and the lateral direction of the collector is defined as [1⁻10] direction ("⁻" represents a bar).

Figure 16:
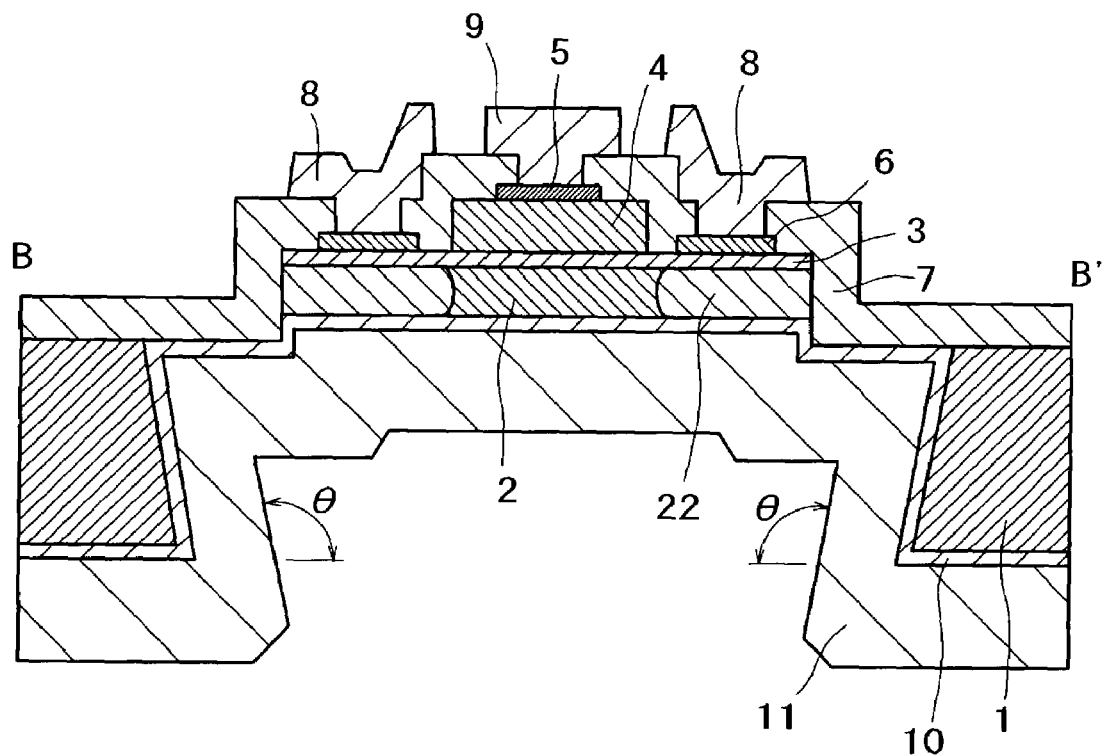
FIG. 16 is a cross sectional view for a portion taken along line B–B' shown in FIG. 15.
Figure 17:
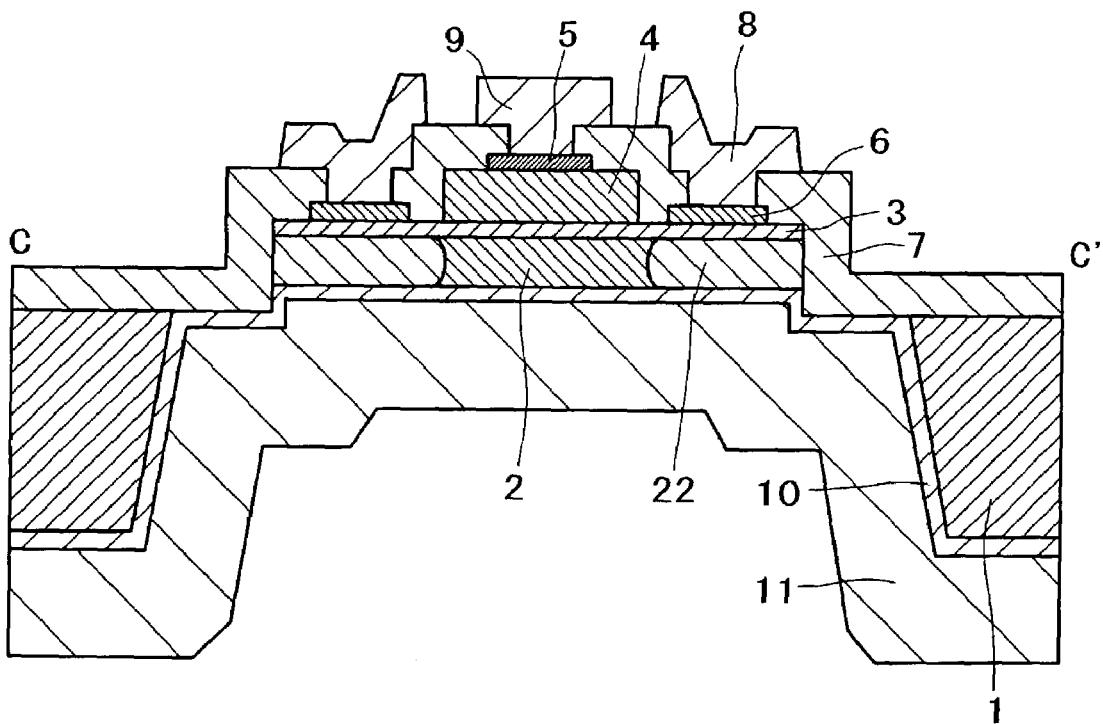
FIG. 17 is a cross sectional view for a portion taken along line C–C' shown in FIG. 15.
Figure 18:
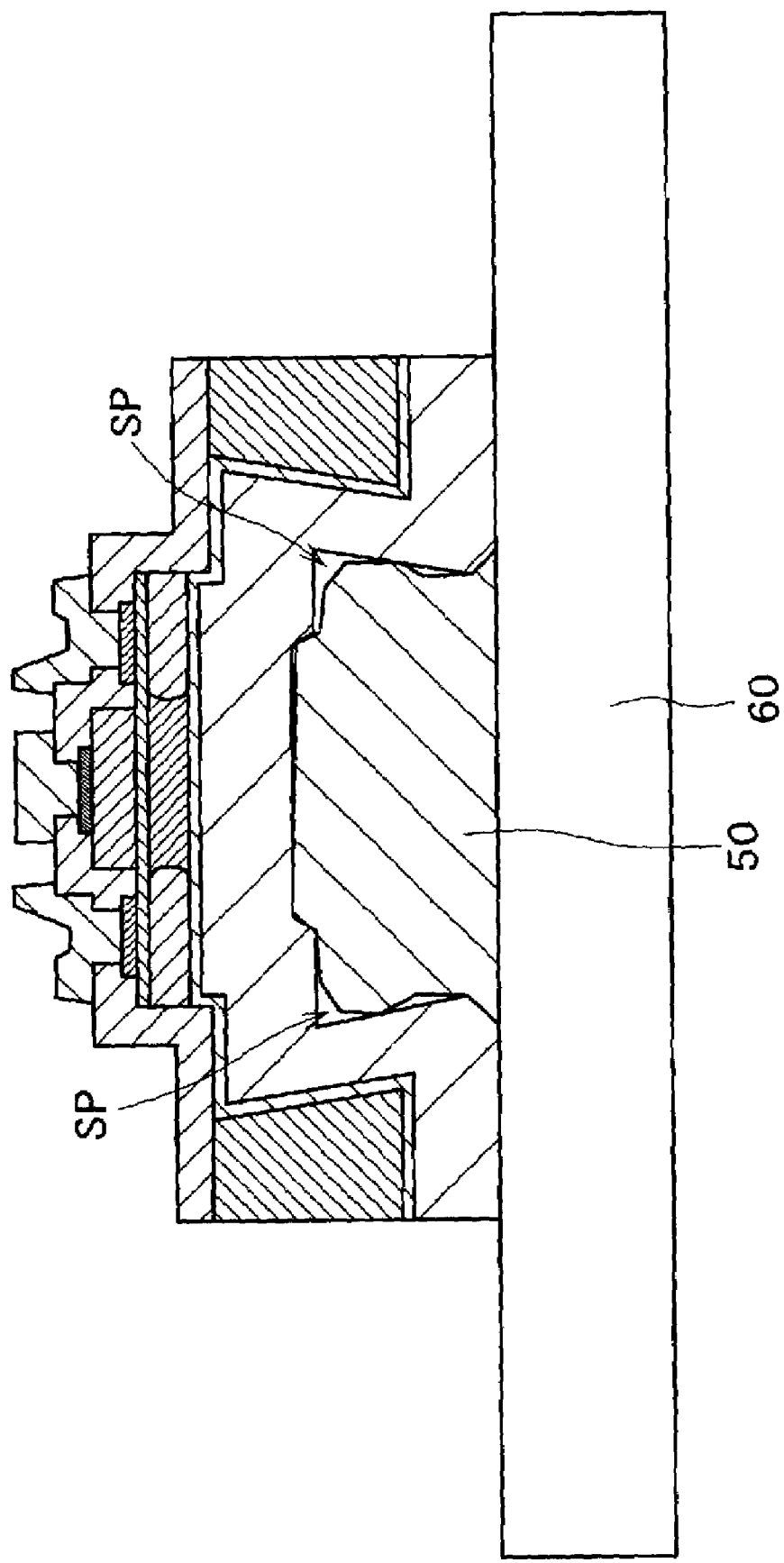
FIG. 18 is an explanatory view showing a space in an epoxy resin formed upon bonding the chip of the cross sectional structure shown in FIG. 16.

In this case, when a via hole was formed by wet etching from the back side of the substrate, anisotropy on the crystallographic direction was observed and the cross sectional shape thereof is as shown in FIG. 16 and FIG. 17, respectively, along a cross section vertical to the collector (cross section along line B–B') and a cross section in parallel therewith (cross section along C–C'). Particularly, in a case where a via hole having a cross sectional area narrow at the inlet and widened toward the bottom was formed with an angle θ between the hole wall and the back side of the substrate being of larger than 90°, when a semiconductor chip is bonded to a mounting substrate such as a ceramic substrate 60 by an epoxy resin 50, a space SP not filled with the epoxy resin was left at the deep most portion of the trench as shown in FIG. 18. In a case where such a space SP was formed, when heat treatment was applied for curing the epoxy resin 50, occurrence of cracks was observed at the periphery of via hole at a high probability exceeding 10%. In a case where the cross sectional shape of the via hole was as shown in FIG. 17 or FIG. 1, the space SP was not formed in the deep most portion of the trench upon filling of the epoxy resin.

Figure 15:
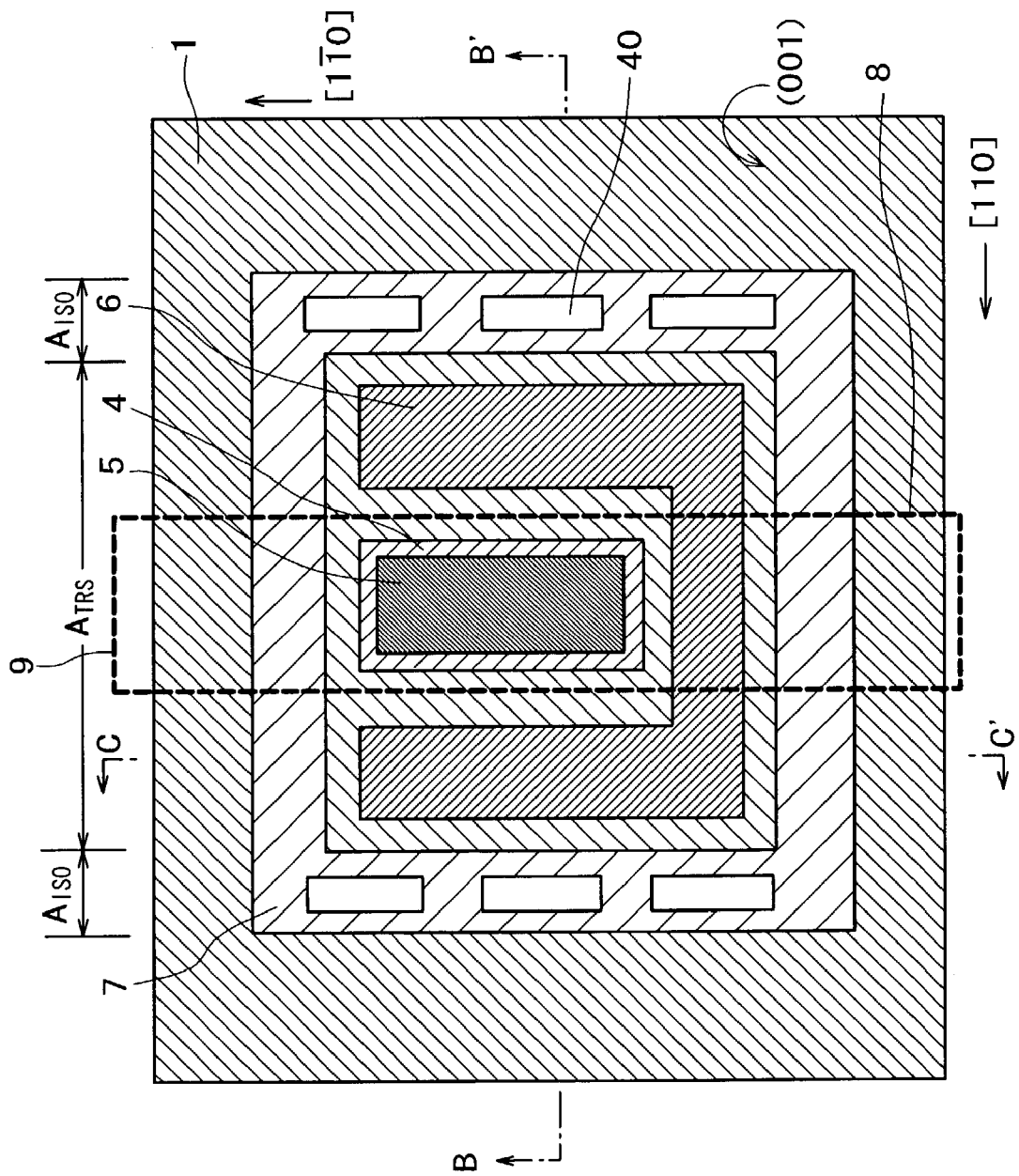
FIG. 15 is a plan view showing a semiconductor device provided with an opening of a fifth embodiment according to the invention.

Then, in this embodiment, openings 40 were formed as shown in FIG. 15 particularly to the not filled space SP. That is, while considering the crystallographic direction, the openings 40 were disposed in the isolation regions $A_{ISO}$, along two sides of a rectangular transistor regions $A_{TRS}$, while such openings were not formed along the remaining two sides. The bonding yield of the devices thus manufactured was high and, particularly, occurrence of cracks at the periphery of the via hole was not observed.

Accordingly, reliability upon bonding of the chip can be improved by forming the openings 40 in the surface protection film so as not to leave the space SP in the via hole not in communication with the outside while considering the crystallographic direction. Further, wiring layout was applied such that the base wirings 8 and the collector wirings are not applied on the sides in which the openings 40 were formed and formed to the two sides not formed with the openings 40 such that the base wirings 8 and the collector wirings 9 extended thereon as shown by broken lines. This can attain a layout in which holes for allowing the solvent vapor to pass therethrough and the wiring lead outs do not interfere with each other while avoiding destruction by chip cracks during bonding.

While the present invention has been described with respect to several preferred embodiments, the present invention is not restricted to the embodiments described above but it is apparent that various design changes are possible within a range not departing the gist of the invention.

As apparent from the preferred embodiments described above, the semiconductor device according to the present invention of disposing a via hole over a region larger than the transistor region can facilitate production by taking a large alignment margin for the back side fabrication step for obtaining electrode contact by way of the via hole from the back side of the semiconductor at the lowermost layer, and can prevent chip destruction by cracks.

Further, provision of the openings reaching the via hole to the surface protection insulating film for connecting the substrate and the transistor region can release the solvent vapors of the adhesives in the inside of the via hole and can avoid the pressure elevation in the via hole.

What is claimed is:
1. A semiconductor device, comprising:
   a substrate
   a via hole formed in the substrate:
   a semiconductor region comprising an emitter region, a base region, and a collector region laminated from a side of the semiconductor region near a first side of the substrate;

an insulating protection film disposed on a surface of the semiconductor region and a surface of the first side of the substrate;

a wiring layer disposed in the via hole and along a second side of the substrate distant from the semiconductor region, the wiring layer in contact with the emitter region, wherein the semiconductor region and the substrate are isolated and connected by the insulating protection film.

2. The semiconductor device of claim 1, wherein a region of the via hole disposed on a back side of the substrate is larger than said semiconductor region which is a transistor region formed from the laminated semiconductor region.

3. The semiconductor device of claim 2, wherein the transistor region and the substrate are isolated, and connected by the insulating protection film.

4. The semiconductor device according to claim 1, further comprising an electrode on the emitter region, wherein the wiring layer makes contact with the emitter region through the electrode.

5. The semiconductor device according to claim 1, wherein the semiconductor region is located above the first side of the substrate and directly over the via hole.

6. The semiconductor device according to claim 1, wherein the semiconductor region is above the via hole and contained within an area defined by a projection emanating from the via hole.

7. The semiconductor device according to claim 6, wherein the wiring layer directly contacts the electrode along an entire side of the electrode opposite the semiconductor region.

8. The semiconductor device according to claim 1, wherein the substrate comprises a semi-insulating GaAs substrate.

9. A semiconductor device, comprising:

a substrate a via hole formed in the substrate;

a semiconductor region comprising an emitter region, a base region, and a collector region laminated from a side of the semiconductor region near a first side of the substrate;

an insulating protection film disposed on a surface of the semiconductor region and a surface of the first side of the substrate;

a wiring layer disposed in the via hole and along a second side of the substrate distant from the semiconductor region, the wiring layer in contact with the emitter region; and an electrode on the emitter region, wherein the wiring layer makes contact with the emitter region through the electrode, and wherein the electrode is disposed on the emitter region and interior sides of the via hole.

10. The semiconductor device according to claim 9, wherein the electrode is disposed on the emitter region, interior sides of the via hole, and the second side of the substrate.

* * * * *